(12) United States Patent
Shchegrov et al.

(10) Patent No.: US 10,533,848 B2
(45) Date of Patent: Jan. 14, 2020

(54) METROLOGY AND CONTROL OF OVERLAY AND EDGE PLACEMENT ERRORS

(71) Applicant: KLA-Tencor Corporation, Milpitas, CA (US)

(72) Inventors: Andrei V. Shchegrov, Campbell, CA (US); Frank Laske, Weilburg (DE); Nadav Gutman, Zichron Ya'aqov (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/057,498

(22) Filed: Aug. 7, 2018

(65) Prior Publication Data

US 2019/0271542 A1 Sep. 5, 2019

Related U.S. Application Data

(60) Provisional application No. 62/638,900, filed on Mar. 5, 2018.

(51) Int. Cl.
*G01B 11/27* (2006.01)
*G03F 7/20* (2006.01)
*G01B 15/00* (2006.01)

(52) U.S. Cl.
CPC ............ *G01B 11/272* (2013.01); *G01B 15/00* (2013.01); *G03F 7/70633* (2013.01)

(58) Field of Classification Search
CPC .... G01B 11/272; G01B 15/00; G03F 7/70633

(Continued)

(56) References Cited

U.S. PATENT DOCUMENTS 5,617,340 A 4/1997 Cresswell et al.
5,757,507 A * 5/1998 Ausschnitt .......... G03F 7/70625
250/548

(Continued)

FOREIGN PATENT DOCUMENTS

EP 1162507 B1 3/2007
WO 2014159787 A1 10/2014
WO 2018004511 A1 1/2018

OTHER PUBLICATIONS

International Search Report and Written Opinion dated Jun. 17, 2019 for PCT/US2019/020471.

*Primary Examiner* — Isiaka O Akanbi
(74) *Attorney, Agent, or Firm* — Suiter Swantz pc llo

(57) ABSTRACT

An overlay metrology system may include a controller to generate optical tool error adjustments for a hybrid overlay target including optically-resolvable features and device-scale features by measuring a difference between an optical overlay measurement based on the optically-resolvable features and a device-scale overlay measurement based on the device-scale features, generate target-to-device adjustments for the hybrid overlay target based on positions of features within the device area, determine device-relevant overlay measurements for one or more locations in the device area based on at least one of the optical overlay measurement, the optical tool error adjustments, or the target-to-device adjustments, and provide overlay correctables for the device area to a lithography tool to modify exposure conditions for at least one subsequent exposure based on the device-relevant overlay measurements.

42 Claims, 9 Drawing Sheets

(58) Field of Classification Search
USPC .......................................................... 356/400
See application file for complete search history.

(56) References Cited

U.S. PATENT DOCUMENTS

| | | |
|---|---|---|
| 6,484,060 B1 | 11/2002 | Baluswamy et al. |
| 6,982,793 B1 | 1/2006 | Yang et al. |
| 8,260,033 B2 | 9/2012 | Arnz et al. |
| 8,330,281 B2 | 12/2012 | Ghinovker et al. |
| 9,093,458 B2 | 7/2015 | Amir et al. |
| 9,329,033 B2 | 5/2016 | Amit et al. |
| 9,704,238 B2 | 7/2017 | Eyring et al. |
| 10,141,156 B2 | 11/2018 | Neil et al. |
| 10,303,153 B2 | 5/2019 | Czerkas et al. |
| 2001/0055720 A1 | 12/2001 | Sato et al. |
| 2005/0068515 A1 | 3/2005 | Bauch et al. |
| 2005/0105092 A1 | 5/2005 | Ausschnitt et al. |
| 2007/0064232 A1 | 3/2007 | Yang et al. |
| 2007/0069398 A1 | 3/2007 | Smith et al. |
| 2009/0087756 A1 | 4/2009 | Schulz |
| 2009/0186286 A1 | 7/2009 | Ausschnitt et al. |
| 2013/0035888 A1* | 2/2013 | Kandel ............... G03F 7/70633 702/81 |
| 2013/0208279 A1* | 8/2013 | Smith .................... G01B 11/26 356/401 |
| 2014/0060148 A1* | 3/2014 | Amit .................... G01B 21/042 73/1.79 |
| 2014/0118721 A1 | 5/2014 | Shyu et al. |
| 2014/0307256 A1 | 10/2014 | Amir |
| 2015/0177135 A1* | 6/2015 | Amit ..................... G01N 21/47 702/150 |
| 2015/0235108 A1* | 8/2015 | Pandev ................ G06K 9/6255 382/149 |
| 2016/0003609 A1* | 1/2016 | Shchegrov ........... G03F 7/7065 356/625 |
| 2016/0253450 A1* | 9/2016 | Kandel ................. H01L 22/30 356/401 |
| 2016/0320319 A1* | 11/2016 | Hench ................. G01N 23/207 |
| 2017/0343903 A1* | 11/2017 | Lee .................... G03F 7/70283 |
| 2019/0122357 A1 | 4/2019 | Grunzweig et al. |

* cited by examiner

METROLOGY AND CONTROL OF OVERLAY AND EDGE PLACEMENT ERRORS

CROSS-REFERENCE TO RELATED APPLICATION

The present application claims the benefit under 35 U.S.C. § 119(e) of U.S. Provisional Application Ser. No. 62/638,900, filed Mar. 5, 2018, entitled SYSTEMS AND METHODS FOR METROLOGY AND CONTROL OF OVERLAY AND EDGE PLACEMENT ERRORS FOR SEMICONDUCTOR DEVICES, naming Andrei V. Shchegrov, Frank Laske, and Nadav Gutman as inventors, which is incorporated herein by reference in the entirety.

TECHNICAL FIELD

The present disclosure relates generally to overlay metrology and, more particularly, to determining device-relevant overlay metrology using optical metrology tools.

BACKGROUND

Semiconductor fabrication typically requires fabricating multiple layers on a structure in which some or all of the layers include fabricated features. Overlay metrology is the measurement of the relative positions of structures on various layers of a sample, which are critical to the performance of a fabricated device and must typically be controlled within tight tolerances. For example, overlay metrology may measure the relative positions of features on different sample layers as a measure of the layer-by-layer alignment of fabrication tools. By way of another example, overlay metrology may measure the relative positions of features on the same layer as a measure of the alignment of multiple exposure steps on the sample layer.

Not all device feature layouts are amenable to direct overlay measurements. Further, overlay measurements may damage or otherwise affect the performance of device features. Accordingly, overlay measurements are commonly performed on dedicated overlay targets having features designed for sensitive overlay measurements rather than directly on device features. However, differences in size, orientation, density, and/or location on the sample of overlay targets relative to the device features may introduce a mismatch between measured overlay at the target and actual overlay of device features. Accordingly, ensuring device-relevant overlay measurements on overlay targets remains an ongoing challenge in overlay metrology.

Further, efforts to achieve device-relevant overlay measurements must typically be balanced with throughput requirements. For example, overlay targets with device-scale features may provide device-relevant overlay. However, device-scale features are typically resolvable using particle-beam metrology tools such as, but not limited to, scanning electron microscopes (SEMs) that may limit throughput in a production environment. In contrast, optical overlay metrology may provide higher throughput, but may require overlay target features substantially larger than device features and may thus be more susceptible to errors.

It is therefore desirable to provide systems and methods for overlay metrology that provide device-relevant overlay accuracy while balancing throughput requirements.

SUMMARY

An overlay metrology system is disclosed in accordance with one or more illustrative embodiments of the present disclosure. In one illustrative embodiment, the system includes a controller. In another illustrative embodiment, the controller generates optical tool error adjustments for a hybrid overlay target including optically-resolvable features and device-scale features by measuring a difference between an optical overlay measurement based on the optically-resolvable features and a device-scale overlay measurement based on the device-scale features. In another illustrative embodiment, the controller generates target-to-device adjustments for the hybrid overlay target based on positions of features within the device area. In another illustrative embodiment, the controller determines device-relevant overlay measurements for one or more locations in the device area based on at least one of the optical overlay measurement, the optical tool error adjustments, or the target-to-device adjustments. In another illustrative embodiment, the controller provides overlay correctables for the device area to a lithography tool to modify exposure conditions for at least one subsequent exposure based on the device-relevant overlay measurements.

An overlay metrology system is disclosed in accordance with one or more illustrative embodiments of the present disclosure. In one illustrative embodiment, the system includes an optical metrology tool configured to generate an optical overlay measurement based on optically-resolvable features of a hybrid overlay target on a sample. In another illustrative embodiment, the system includes a particle-beam metrology tool configured to generate a device-scale overlay measurement based on device-scale features of the hybrid overlay target. In another illustrative embodiment, the system includes an edge-placement metrology tool configured to measure positions of features within a device area of the sample with respect to the hybrid overlay target. In another illustrative embodiment, the system includes a controller communicatively coupled to the optical metrology tool and the particle-beam metrology tool. In another illustrative embodiment, the controller generates optical tool error adjustments for the hybrid overlay target based on a difference between the optical overlay measurement received by the optical metrology tool and the device-scale overlay measurement received by the particle-beam metrology tool. In another illustrative embodiment, the controller generates target-to-device adjustments for the hybrid overlay target based on positions of features within the device area received by the edge-placement metrology tool. In another illustrative embodiment, the controller determines device-relevant overlay measurements for one or more locations in the device area based on at least one of the optical overlay measurement, the optical tool error adjustments, or the target-to-device adjustments. In another illustrative embodiment, the controller provides overlay correctables for the device area to a lithography tool to modify exposure conditions for at least one subsequent exposure based on the device-relevant overlay measurements.

An overlay metrology method is disclosed in accordance with one or more illustrative embodiments of the present disclosure. In one illustrative embodiment, the method includes measuring an optical overlay of a hybrid overlay target on a sample based on optically-resolvable elements of the hybrid overlay target. In another illustrative embodiment, the method includes measuring a device-scale overlay of the hybrid overlay target based on device-scale elements of the hybrid overlay target. In another illustrative embodiment, the method includes determining optical tool error adjustments for the hybrid overlay target based on a difference between the optical overlay and the device-scale overlay. In another illustrative embodiment, the method includes measuring target-to-device placement errors for one or more features within the device area with respect to the hybrid overlay target. In another illustrative embodiment, the method includes generating one or more target-to-device adjustments for the device area based on the target-to-device placement errors. In another illustrative embodiment, the method includes determining device-relevant overlay measurements for one or more positions within the device area based on the optical overlay, the optical tool error adjustments, and the target-to-device adjustments. In another illustrative embodiment, the method includes providing overlay correctables for the device area to a lithography tool to modify exposure conditions for at least one subsequent sample based on the device-relevant overlay measurements.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
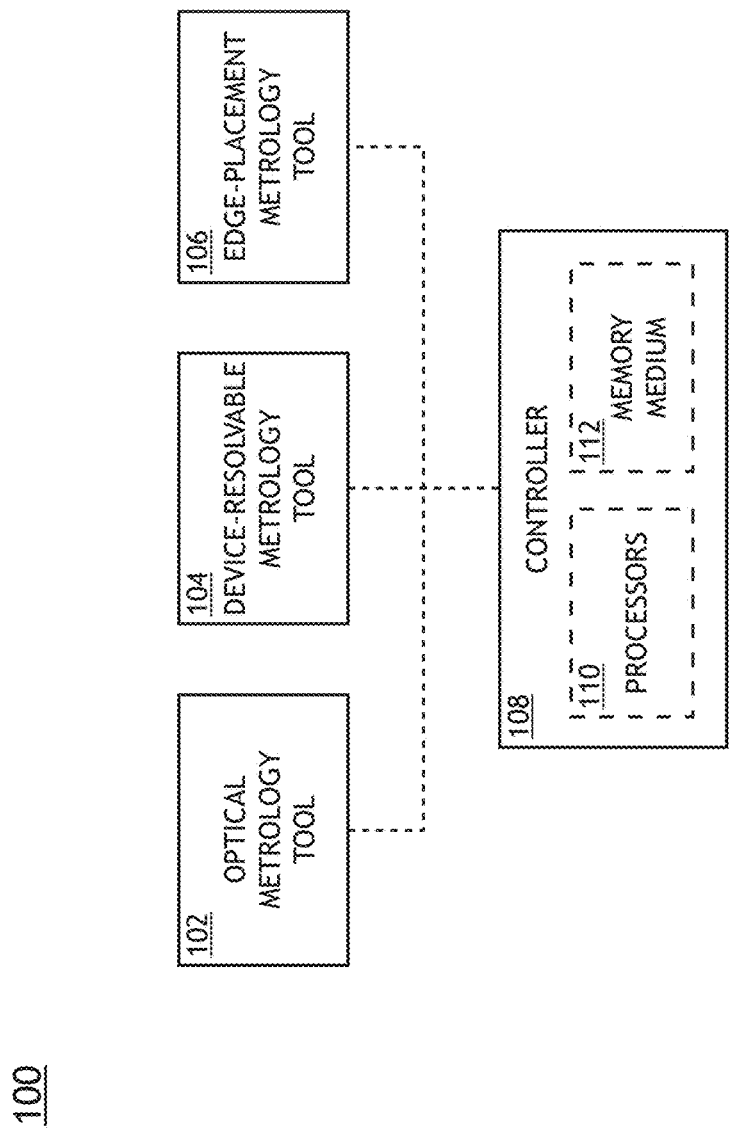
FIG. 1A is a conceptual view of an overlay metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for generating device-relevant overlay measurements by adjusting optical overlay measurements with device-relevant corrections. For example, device-relevant corrections may compensate for errors associated with a mismatch between a measured optical overlay of an overlay target and the actual overlay of device features of interest on a sample.

Optical metrology tools may provide high-throughput overlay measurements suitable for in-line overlay control. For example, imaging-based optical overlay may simultaneously image features on multiple sample layers and determine overlay based on relative displacements between the features. By way of another example, scatterometry-based optical metrology may determine overlay using a model-based approach in which light scattered and/or diffracted from the sample is compared to expected patterns based on known sample features such as, but not limited to, grating structures in overlapping layers. The features of overlay targets suitable for optical characterization may additionally be segmented to provide multiple measurement points within a single field of view, which may facilitate highly precise overlay measurements with low noise based statistical averaging of repetitive structures. Further, optical metrology tools may provide, but are not required to provide, measurements on the order of 0.2 to 1 second per site and may thus provide substantial flexibility for the frequency of measurements per sample and per lot in a production line.

However, the resolution of optical metrology tools may require overlay target features considerably larger than the device features, which may introduce systematic errors between the measured overlay and device-relevant overlay. For example, the device-relevant overlay ($OVL_{device}$) may be, but is not required to be, represented as:

$$OVL_{device} = OVL_{target} + (\text{Optical Tool Error})_{target} \Delta PPE_{target\_to\_device} \quad (1)$$

where $OVL_{target}$ is an optical overlay measured at an overlay target, (Optical Tool Error)$_{target}$ is a target error associated with a bias between the optical measurement based on optically-resolvable features and a device-relevant overlay at the target location, and $\Delta PPE_{target\_to\_device}$ is a target-to-device error associated with spatially-varying fabrication variations associated with the physical separation between the overlay target and the device features of interest. For example, $\Delta PPE_{target\_to\_device}$ may represent differences between the pattern placement error (PPE) between the overlay target and the device features of interest for different layers on the sample.

Additional embodiments of the present disclosure are directed to measuring overlay of a hybrid overlay target having optically-resolvable features and device-scale features with multiple metrology tools. For example, an optical metrology tool may measure overlay based on the optically-resolvable features using any optical overlay technique (e.g., image-based optical metrology, scatterometry-based optical metrology, or the like) and an additional metrology tool having sufficient resolution to resolve the device-scale features may measure overlay based on the device-scale features. In this regard, the (Optical Tool Error)$_{target}$ of equation 1 may include the difference between the optical overlay measurement and the device-scale overlay measurement on the same target.

The additional metrology tool may include any type of metrology tool suitable for determining overlay from device-scale features. For example, the additional metrology tool may include a particle-beam metrology tool such as, but not limited to, a scanning electron microscope (SEM) metrology tool (e.g., a critical dimension SEM (CD-SEM), or the like), or a focused ion beam (FIB) metrology tool. Further, particle-beam metrology tools may characterize features on different layers based on the particle beam energy. For example, low-energy particle beams may be used to characterize a top layer (e.g., a current layer), while relatively higher-energy particle beams may penetrate deeper into the sample to characterize features on previously-fabricated layers.

Additional embodiments of the present disclosure are directed to measuring target-to-device errors that lead to location-specific overlay differences within the field, which may be, but are not required to be, associated with intra-field variations during fabrication. Intra-field variations may be induced by aberrations in a lithography tool during an exposure step such as, but not limited to, lens aberrations or turbulence caused by heat in the lithography tool. In this regard, the $\Delta PPE_{target\_to\_device}$ of equation 1 may include measured target-to-device errors. For example, the pattern placement distance between the hybrid overlay target and various features within the die may be directly measured using an edge-position metrology (EPM) tool having a translation state whose position is tightly monitored. In this regard, the hybrid overlay target and the features within the die may be imaged using the EPM tool and pattern placement distances may be determined based on the coordinates of the translation stage. Further, the EPM tool may be based on any type of imaging technology such as, but not limited to, optical or particle-beam imaging (e.g., electron-beam, ion-beam, or the like). The measurement of the positions and dimensions of structures using edge-placement metrology is generally described in Intl Pub. No. WO 2018/004511 titled "APPARATUS AND METHOD FOR THE MEASUREMENT OF PATTERN PLACEMENT AND SIZE OF PATTERN AND COMPUTER PROGRAM THEREFOR" and published on Jan. 4, 2018, and U.S. Pat. No. 9,704,238 titled METHOD FOR CORRECTING POSITION MEASUREMENTS FOR OPTICAL ERRORS AND METHOD FOR DETERMINING MASK WRITER ERRORS" and issued on Jul. 11, 2017, both of which are incorporated by reference herein in their entirety.

Additional embodiments of the present disclosure are directed to generating device-relevant overlay measurements based on the device-relevant adjustments to optical metrology measurements. Further embodiments of the present disclosure are directed to generating device-relevant overlay correctables based on the device-relevant overlay measurements. The overlay correctables may then be provided to fabrication tools (e.g., lithography tools) as feedback and/or feedforward data. For example, overlay measurements associated with a current process step measured on a sample may be used to compensate for drifts and maintain overlay within selected tolerances for the process step on subsequent samples in the same or subsequent lots. By way of another example, overlay measurements associated with a current process step may be fed-forward to adjust subsequent process steps to compensate for any measured overlay errors.

It is recognized herein that the frequency at which overlay correctables may be generated (on a given sample and/or a given lot) may depend on tradeoffs between the accuracy and throughput of overlay metrology tools. For example, it may not be practical or desirable to measure the optical tool error or the target-to-device error for every sample or for every lot. In some embodiments, device-relevant adjustments to optical overlay measurements are performed less frequently than the optical overlay measurements. In this regard, in-line overlay measurements may be performed using optical metrology tools on hybrid overlay targets at a desired frequency and may be adjusted based on previously measured device-relevant adjustments based on the optical tool error and/or the target-to-device errors.

Additional embodiments of the present disclosure are directed to overlay measurements generated as an after-development-inspection (ADI) step. In this regard, the optical metrology tool may capture overlay data directly on samples during fabrication temporally proximate to the development step without damaging the samples. Further, identifying potential issues at this stage may facilitate reworking of samples in the current or future lots to correct the issues prior to a time-consuming and irreversible etching step.

Referring now generally to FIGS. 1A through 1D, an overlay metrology system providing device-relevant optical overlay measurements is described.

FIG. 1A is a conceptual view of an overlay metrology system 100, in accordance with one or more embodiments of the present disclosure. In one embodiment, the overlay metrology system 100 includes an optical metrology tool 102 suitable for generating overlay measurements based on optically-resolvable features. In another embodiment, the overlay metrology system 100 includes a particle-beam metrology tool 104 suitable for generating overlay measurements based on device features and/or device-scale features of overlay targets. In another embodiment, the overlay metrology system 100 includes an edge-placement metrology (EPM) tool 106 suitable for determining pattern placement positions (e.g., feature registration positions) in one or more layers.

Accordingly, the optical metrology tool 102 may provide optical overlay measurements of one or more overlay targets and any combination of the particle-beam metrology tool 104 and the EPM tool 106 may provide measurements suitable for device-relevant adjustments to the optical overlay measurements. Further, as described previously herein, the overlay metrology system 100 may utilize any component (e.g., the optical metrology tool 102, the particle-beam metrology tool 104, or the EPM tool 106) at any selected frequency in a production line to balance overlay accuracy and throughput requirements. For example, the optical metrology tool 102 may be used for in-line overlay monitoring, while the particle-beam metrology tool 104 and/or the EPM tool 106 may be selectively used at lower frequencies to determine device-relevant adjustments to the optical overlay measurements provided by the optical metrology tool 102.

In another embodiment, the overlay metrology system 100 includes a controller 108. In another embodiment, the controller 108 includes one or more processors 110 configured to execute program instructions maintained on a memory medium 112. In this regard, the one or more processors 110 of controller 108 may execute any of the various process steps described throughout the present disclosure. For example, the controller 108 may receive data from any of the optical metrology tool 102, the particle-beam metrology tool 104, or the EPM tool 106 and may further generate device-relevant overlay data. By way of another example, the controller 108 may generate device-relevant overlay correctables based on data from any of the optical metrology tool 102, the particle-beam metrology tool 104, or the EPM tool 106.

Further, the controller 108 may be communicatively coupled to one or more external fabrication tools such as, but not limited to, a lithography tool. In this regard, the controller 108 may operate as an advanced process controller (APC) suitable for controlling the inputs of the external fabrication tools to maintain overlay within selected overlay tolerances.

The one or more processors 110 of a controller 108 may include any processing element known in the art. In this sense, the one or more processors 110 may include any microprocessor-type device configured to execute algorithms and/or instructions. In one embodiment, the one or more processors 110 may consist of a desktop computer, mainframe computer system, workstation, image computer, parallel processor, or any other computer system (e.g., networked computer) configured to execute a program configured to operate the overlay metrology system 100, as described throughout the present disclosure. It is further recognized that the term "processor" may be broadly defined to encompass any device having one or more processing elements, which execute program instructions from a non-transitory memory medium 112. Further, the steps described throughout the present disclosure may be carried out by a single controller 108 or, alternatively, multiple controllers. Additionally, the controller 108 may include one or more controllers housed in a common housing or within multiple housings. In this way, any controller or combination of controllers may be separately packaged as a module suitable for integration into overlay metrology system 100.

The memory medium 112 may include any storage medium known in the art suitable for storing program instructions executable by the associated one or more processors 110. For example, the memory medium 112 may include a non-transitory memory medium. By way of another example, the memory medium 112 may include, but is not limited to, a read-only memory, a random access memory, a magnetic or optical memory device (e.g., disk), a magnetic tape, a solid state drive, and the like. It is further noted that memory medium 112 may be housed in a common controller housing with the one or more processors 110. In one embodiment, the memory medium 112 may be located remotely with respect to the physical location of the one or more processors 110 and controller 108. For instance, the one or more processors 110 of controller 108 may access a remote memory (e.g., server), accessible through a network (e.g., internet, intranet, and the like). Therefore, the above description should not be interpreted as a limitation on the present invention but merely an illustration.

It is to be understood that the overlay metrology system 100 illustrated in FIG. 1A along with the associated descriptions is provided solely for illustrative purposes and should not be interpreted as limiting. For example, the overlay metrology system 100 may include any combination of elements illustrated in FIG. 1A. In one instance, the overlay metrology system 100 may include an optical metrology tool 102, a particle-beam metrology tool 104, and a controller 108. In another instance, the overlay metrology system 100 may include an optical metrology tool 102, an EPM tool 106, and a controller 108. Further, any components of the overlay metrology system 100 may be located proximate to each other or may be remotely located from each other. In some embodiments, multiple components of the overlay metrology system 100 may be integrated into a single physical device. For example, the EPM tool 106 may be, but is not required to be, integrated into the optical metrology tool 102 or the particle-beam metrology tool 104.

Figure 1B:
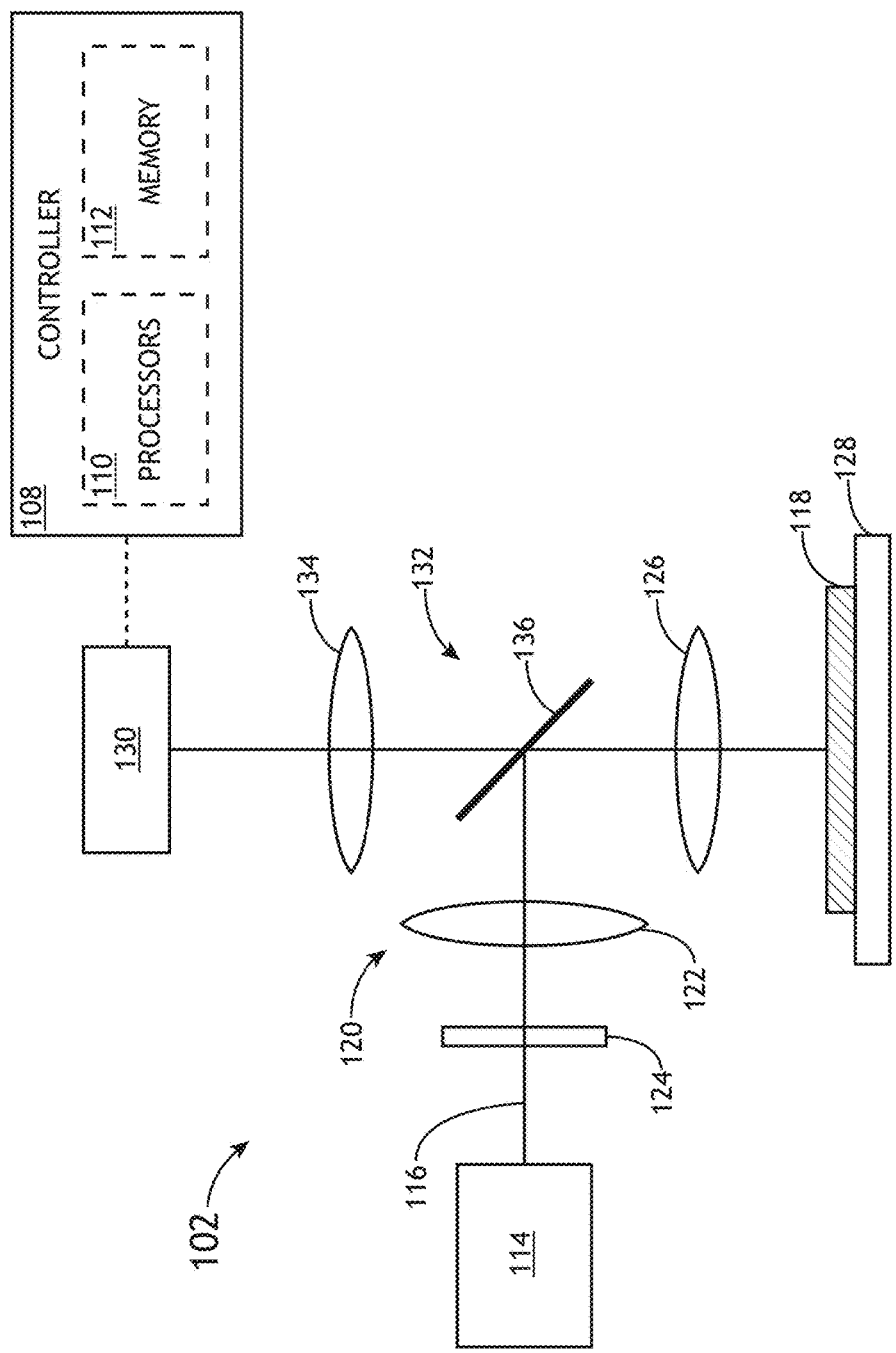
FIG. 1B is a conceptual view of an optical metrology tool, in accordance with one or more embodiments of the present disclosure.

FIG. 1B is a conceptual view of an optical metrology tool 102, in accordance with one or more embodiments of the present disclosure. The optical metrology tool 102 may include any type of optical overlay metrology tool known in the art suitable for generating overlay data associated with two or more layers of a sample such as, but not limited to, an image-based optical metrology tool or a scatterometry-based optical metrology tool.

In one embodiment, the optical metrology tool 102 includes an optical illumination source 114 to generate an optical illumination beam 116. The optical illumination beam 116 may include one or more selected wavelengths of light including, but not limited to, ultraviolet (UV) light, visible light, or infrared (IR) light.

The optical illumination source 114 may be any type of illumination source known in the art suitable for generating an optical illumination beam 116.

The optical illumination source 114 may include any type of illumination source suitable for providing an optical illumination beam 116. In one embodiment, the optical illumination source 114 is a laser source. For example, the optical illumination source 114 may include, but is not limited to, one or more narrowband laser sources, a broadband laser source, a supercontinuum laser source, a white light laser source, or the like. In this regard, the optical illumination source 114 may provide an optical illumination beam 116 having high coherence (e.g., high spatial coherence and/or temporal coherence). In another embodiment, the optical illumination source 114 includes a laser-sustained plasma (LSP) source. For example, the optical illumination source 114 may include, but is not limited to, a LSP lamp, a LSP bulb, or a LSP chamber suitable for containing one or more elements that, when excited by a laser source into a plasma state, may emit broadband illumination. In another embodiment, the optical illumination source 114 includes a lamp source. For example, the optical illumination source 114 may include, but is not limited to, an arc lamp, a discharge lamp, an electrode-less lamp, or the like. In this regard, the optical illumination source 114 may provide an optical illumination beam 116 having low coherence (e.g., low spatial coherence and/or temporal coherence).

In another embodiment, the optical illumination source 114 directs the optical illumination beam 116 to a sample 118 via an illumination pathway 120. The illumination pathway 120 may include one or more illumination pathway lenses 122 or additional optical components 124 suitable for modifying and/or conditioning the optical illumination beam 116. For example, the one or more optical components 124 may include, but are not limited to, one or more polarizers, one or more filters, one or more beam splitters, one or more diffusers, one or more homogenizers, one or more apodizers, or one or more beam shapers. The illumination pathway 120 may further include an objective lens 126 configured to direct the optical illumination beam 116 to the sample 118.

In another embodiment, the sample 118 is disposed on a sample stage 128. The sample stage 128 may include any device suitable for positioning and/or scanning the sample 118 within the optical metrology tool 102. For example, the sample stage 128 may include any combination of linear translation stages, rotational stages, tip/tilt stages, or the like.

In another embodiment, the optical metrology tool 102 includes a detector 130 configured to capture light emanating from the sample 118 through a collection pathway 132. The collection pathway 132 may include, but is not limited to, one or more collection pathway lenses 134 for collecting light from the sample 118. For example, a detector 130 may receive light reflected or scattered (e.g., via specular reflection, diffuse reflection, and the like) from the sample 118 via one or more collection pathway lenses 134. By way of another example, a detector 130 may receive light generated by the sample 118 (e.g., luminescence associated with absorption of the optical illumination beam 116, or the like). By way of another example, a detector 130 may receive one or more diffracted orders of light from the sample 118 (e.g., 0-order diffraction, ±1 order diffraction, ±2 order diffraction, and the like).

The detector 130 may include any type of detector known in the art suitable for measuring illumination received from the sample 118. For example, a detector 130 may include, but is not limited to, a CCD detector, a TDI detector, a photomultiplier tube (PMT), an avalanche photodiode (APD), or the like. In another embodiment, a detector 130 may include a spectroscopic detector suitable for identifying wavelengths of light emanating from the sample 118.

The collection pathway 132 may further include any number of optical elements to direct and/or modify collected illumination from the sample 118 including, but not limited to one or more collection pathway lenses 134, one or more filters, one or more polarizers, or one or more beam blocks.

In one embodiment, the detector 130 is positioned approximately normal to the surface of the sample 118. In another embodiment, the optical metrology tool 102 includes a beamsplitter 136 oriented such that the objective lens 126 may simultaneously direct the optical illumination beam 116 to the sample 118 and collect light emanating from the sample 118. Further, the illumination pathway 120 and the collection pathway 132 may share one or more additional elements (e.g., objective lens 126, apertures, filters, or the like).

The optical metrology tool 102 may measure overlay based on any technique known in the art such as, but not limited to, imaged-based techniques or scatterometry-based techniques. For example, the optical metrology tool 102 operating in an imaging mode may illuminate a portion of the sample 118 and capture an image of the illuminated portion of the sample 118 on a detector 130. The captured image may be any type of image known in the art such as, but not limited to, a brightfield image, a darkfield image, a phase-contrast image, or the like. Further, captured images may be stitched together (e.g., by the optical metrology tool 102, by the controller 108, or the like) to form a composite image of the sample 118. By way of another example, the optical metrology tool 102 may scan a focused optical illumination beam 116 across the sample 118 and capture light and/or particles emanating from the sample 118 on one or more detectors 130 at one or more measurement angles to generate an image pixel by pixel. The focused optical illumination beam 116 may be scanned across the sample 118 by modifying the beam path (e.g., using a galvo mirror, a piezo-electric mirror, or the like) and/or by translating the sample 118 through a focal volume of the focused beam. Accordingly, overlay associated with two or more sample layers may be determined based on the relative positions of features located on the two or more sample layers.

By way of another example, the optical metrology tool 102 may operate as a scatterometry-based metrology tool by determining overlay based on the pattern of light scattered and/or diffracted from the sample 118 in response to the optical illumination beam 116. For example, optical metrology tool 102 may capture (e.g., with the detector 130) one or more pupil plane images (e.g., of different regions of an overlay target) including the angular distribution of light emanating from the sample. Accordingly, overlay between two or more sample layers may be determined from the pupil plane images based on modeled scattering and/or diffraction from overlay target features having known sizes and distributions for each layer.

Further, the optical metrology tool 102 may measure overlay at any fabrication step by having the optical illumination beam 116 propagate through a current layer to interact with features on one or more previously fabricated layers such that the signal received by the detector 130 (e.g., an image of the sample 118, an image of a pupil plane, or the like) is indicative of the overlay between at least two layers. For example, the optical metrology tool 102 may measure overlay between a previously-fabricated layer and a current layer as an after-development inspection (ADI) step after the exposure of the current layer. In this regard, an overlay measurement of the current layer and any previous layers may be generated based on differences in the refractive index of exposed features with respect to unexposed features. By way of another example, the optical metrology tool 102 may measure overlay between a previously-fabricated layer and a current layer as an after-etching inspection (AEI) step after a developed pattern has been etched into the current layer as a relief structure.

Figure 1C:
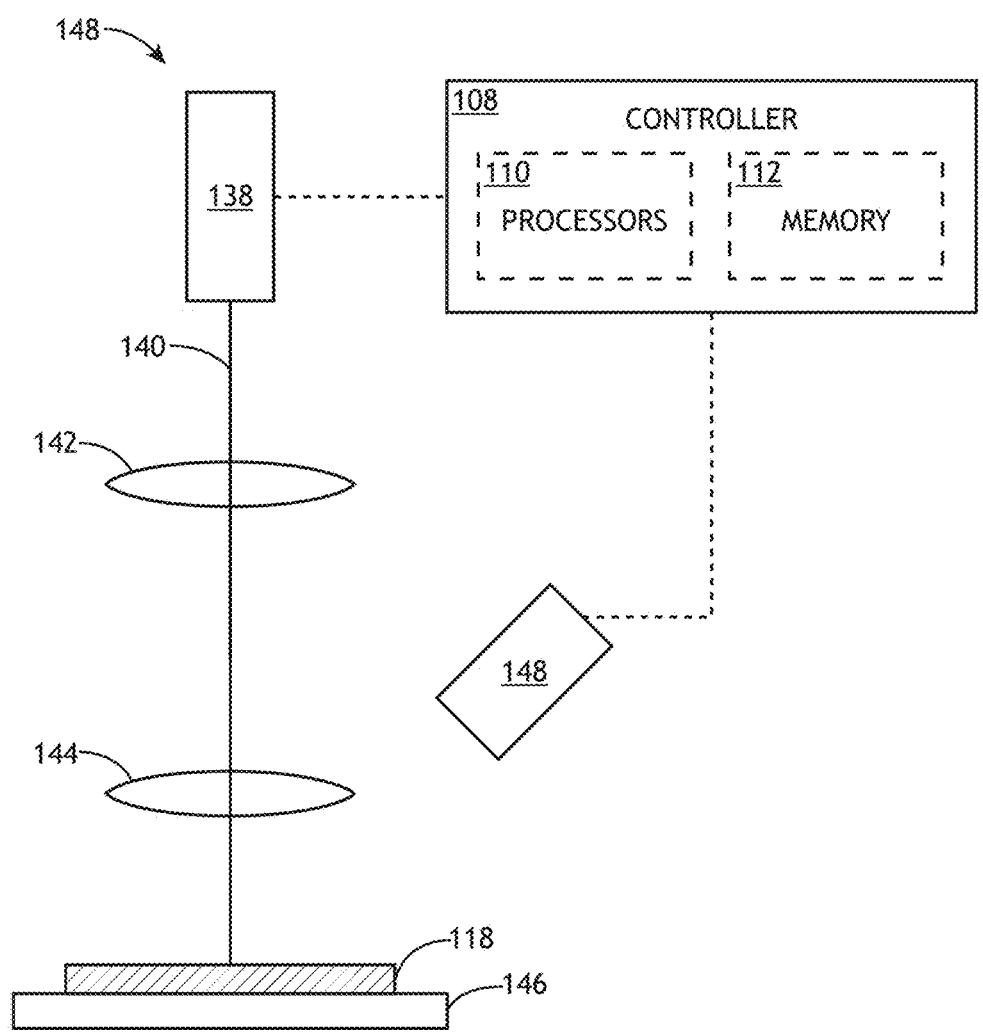
FIG. 1C is a conceptual view of a particle-beam metrology tool, in accordance with one or more embodiments of the present disclosure.

FIG. 1C is a conceptual view of a particle-beam metrology tool 104, in accordance with one or more embodiments of the present disclosure. The particle-beam metrology tool 104 may include any type of metrology tool suitable for resolving device features or device-scale features such as, but not limited to an electron-beam metrology tool (e.g., a SEM, a CD-SEM, or the like), or an ion-beam metrology tool (e.g., a focused-ion-beam (FIB) metrology tool).

In one embodiment, the particle-beam metrology tool 104 includes a particle source 138 (e.g., an electron beam source, an ion beam source, or the like) to generate a particle beam 140 (e.g., an electron beam, a particle beam, or the like). The particle source 138 may include any particle source known in the art suitable for generating a particle beam 140. For example, the particle source 138 may include, but is not limited to, an electron gun or an ion gun. In another embodiment, the particle source 138 is configured to provide a particle beam 140 with a tunable energy. For example, particle source 138 including an electron source may, but is not limited to, provide an accelerating voltage in the range of 0.1 kV to 30 kV. As another example, a particle source 138 including an ion source may, but is not required to, provide an ion beam with an energy in the range of 1 to 50 keV.

In another embodiment, the particle-beam metrology tool 104 includes one or more particle focusing elements 142. For example, the one or more particle focusing elements 142 may include, but are not limited to, a single particle focusing element or one or more particle focusing elements forming a compound system. In another embodiment, the one or more particle focusing elements 142 include a particle objective lens 144 configured to direct the particle beam 140 to the sample 118 located on a sample stage 146. Further, the one or more particle source 138 may include any type of electron lenses known in the art including, but not limited to, electrostatic, magnetic, uni-potential, or double-potential lenses.

In another embodiment, the particle-beam metrology tool 104 includes at least one particle detector 148 to image or otherwise detect particles emanating from the sample 118. In one embodiment, the particle detector 148 includes an electron collector (e.g., a secondary electron collector, a backscattered electron detector, or the like). In another embodiment, the particle detector 148 includes a photon detector (e.g., a photodetector, an x-ray detector, a scintillating element coupled to photomultiplier tube (PMT) detector, or the like) for detecting electrons and/or photons from the sample surface.

It is to be understood that the description of a particle-beam metrology tool 104 as depicted in FIG. 1C and the associated descriptions above are provided solely for illustrative purposes and should not be interpreted as limiting. For example, the particle-beam metrology tool 104 may include a multi-beam and/or a multi-column system suitable for simultaneously interrogating a sample 118. In a further embodiment, the particle-beam metrology tool 104 may include one or more components (e.g., one or more electrodes) configured to apply one or more voltages to one or more locations of the sample 118. In this regard, the particle-beam metrology tool 104 may generate voltage contrast imaging data.

Further, the particle-beam metrology tool 104 may measure overlay at any fabrication step. For example, the particle-beam metrology tool 104 may measure overlay between a previously-fabricated layer and a current layer as an after-development inspection (ADI) step after the exposure and/or development of the current layer. By way of another example, the optical metrology tool 102 may measure overlay between a previously-fabricated layer and a current layer as an after-etching inspection (AEI) step after a developed pattern has been etched into the current layer as a relief structure.

It is recognized herein that the penetration depth of the particle beam 140 in the sample 118 may depend on the particle energy such that higher-energy beams typically penetrate deeper into the sample 118. In one embodiment, the particle-beam metrology tool 104 utilizes different particle energies to interrogate different layers of the device based on the penetration depth of the particle beam 140 into the sample 118. For example, the particle-beam metrology tool 104 may utilize a relatively low-energy electron beam (e.g., approximately 1 keV or less) and may utilize a higher energy beam (e.g., approximately 10 keV or higher) to characterize a previously fabricated layer. It is recognized herein that the penetration depth as a function of particle energy may vary for different materials such that the selection of the particle energy for a particular layer may vary for different materials.

Figure 1D:
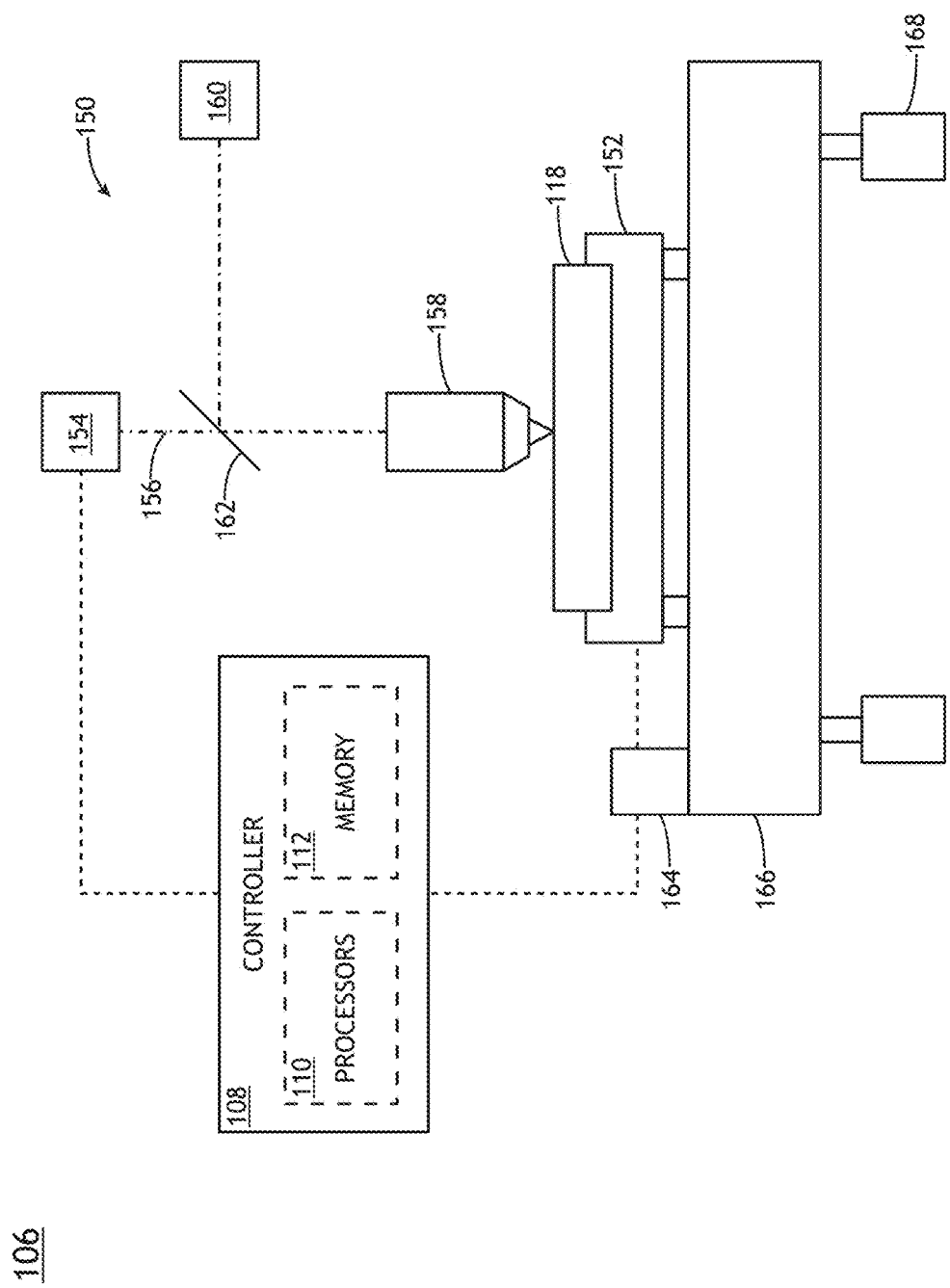
FIG. 1D is a conceptual view of an EPM tool, in accordance with one or more embodiments of the present disclosure.

FIG. 1D is a conceptual view of an EPM tool 106, in accordance with one or more embodiments of the present disclosure. The EPM tool 106 may include any type of metrology tool known in the art suitable for measuring pattern placement distance on two or more features of the sample 118. The measurement of the positions and dimensions of structures using edge-placement metrology is generally described in Intl Pub. No. WO 2018/004511 titled "APPARATUS AND METHOD FOR THE MEASUREMENT OF PATTERN PLACEMENT AND SIZE OF PATTERN AND COMPUTER PROGRAM THEREFOR" and published on Jan. 4, 2018, and U.S. Pat. No. 9,704,238 titled METHOD FOR CORRECTING POSITION MEASUREMENTS FOR OPTICAL ERRORS AND METHOD FOR DETERMINING MASK WRITER ERRORS" and issued on Jul. 11, 2017, both of which are incorporated by reference herein in their entirety.

In one embodiment, the EPM tool 106 includes an EPM imaging system 150 and a precisely-monitored sample stage 152. In this regard, the EPM tool 106 may image two features (e.g., a hybrid overlay target and one or more features within a die as described previously herein) and determine pattern placement distance between the two features based on the coordinates of the sample stage 152.

Further, the EPM imaging system 150 of the EPM tool 106 may include any type of imaging system known in the art. For example, the EPM imaging system 150 may include an optical imaging system. In one instance, the EPM imaging system 150 may include, but is not required to include, an IPRO-series metrology tool from KLA-Tencor. By way of another example, the EPM imaging system 150 may include a particle-beam imaging system such as, but not limited to, SEM-based electrical process monitor (EPM) metrology tools from KLA-Tencor. Further, the EPM tool 106 may be, but is not required to be, integrated within the optical metrology tool 102 illustrated in FIG. 1B and/or the particle-beam metrology tool 104 illustrated in FIG. 1C. By way of another example, the EPM tool 106 may include or more components functionally equivalent to components illustrated in FIG. 1B or 1C without being integrated within the optical metrology tool 102 or the particle-beam metrology tool 104.

In one embodiment, the EPM imaging system 150 includes an illumination source 154 to generate a beam of illumination 156. The illumination source 154 may be any type of illumination source known in the art suitable for generating a beam of illumination 156 such as, but not limited to, an optical illumination source for generating an optical beam or a particle illumination source for generating a particle beam (e.g., an electron beam, an ion beam, or the like).

In another embodiment, the EPM imaging system 150 includes a focusing element 158 to direct the beam of illumination 156 to the sample 118 mounted on the sample stage 152. In another embodiment, the EPM imaging system 150 includes a detector 160 to image or otherwise detect radiation emanating from the sample 118 (e.g., electromagnetic radiation, particles, or the like). The detector 160 may include any type of detector such as, but not limited to an optical detector (e.g., a photodetector, an x-ray detector, a scintillating element coupled to photomultiplier tube (PMT) detector, or the like) or an electron collector (e.g., a secondary electron collector, a backscattered electron detector, or the like). Further, the detector 160 may be oriented to capture radiation emanating from the sample 118 directly or may detect radiation captured by one or more additional elements. In one instance, as illustrated in FIG. 1D, the EPM tool 106 may include a beamsplitter 162 to direct at least a portion of radiation collected by the focusing element 158 to the detector 160.

The sample stage 152 may include any type of translation stage suitable for positioning the sample 118 along two or more axes of motion within selected tolerances (e.g., accuracy tolerances, repeatability tolerances, or the like). For example, the sample stage 152 may include any type of bearing technology such as, but not limited to, air bearing stages or roller bearing stages. Further, the sample stage 152 may include any type of actuation system such as, but not limited to direct-drive actuators or ball-screw actuators.

In another embodiment, the EPM imaging system 150 includes a stage tracking device 164 to precisely track the position of the sample stage 152 along one or more axes. It may be the case, though it is not required to be the case, that an actual position of the sample stage 152 may be determined with a higher accuracy and/or precision than a control system for controlling the position of the sample stage 152. Accordingly, the EPM tool 106 may determine positions of one or more features on the sample 118 (e.g., relative to a field of view of the based at least in part on actual stage positions generated by the stage tracking device 164.

The stage tracking device 164 may be any type of stage-tracking device known in the art suitable for monitoring the positions and/or other tracking data (e.g., velocities, accelerations, or the like) of the sample stage 152 along one or more axes. In one embodiment, the stage tracking device 164 includes one or more interferometers (e.g., laser-based interferometers, or the like).

In another embodiment, the sample stage 152 is mounted on a measuring table 166 suitable for providing a stable mounting surface. For example, the measuring table 166 may include a solid surface (e.g., granite, or the like) providing a precise and stable plane for mounting the sample stage 152. By way of another example, the measuring table 166 may mounted on a vibration isolation system 168 to suppress mechanical vibrations that may reduce the accuracy and/or precision of the stage-tracking measurements.

Figure 2:
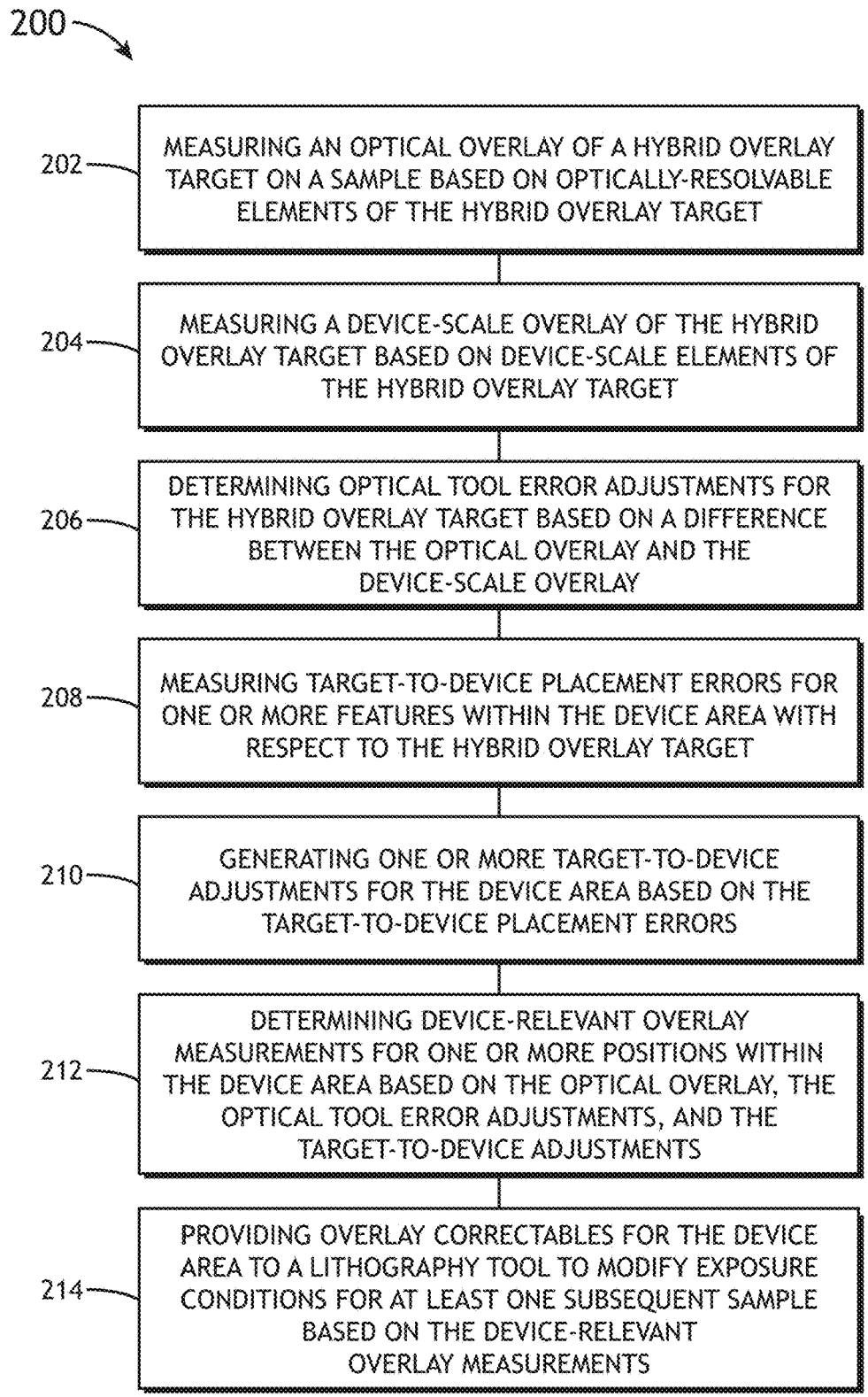
FIG. 2 is a flow diagram illustrating steps performed in a method for device-relevant optical overlay, in accordance with one or more embodiments of the present disclosure.

FIG. 2 is a flow diagram illustrating steps performed in a method 200 for device-relevant optical overlay, in accordance with one or more embodiments of the present disclosure. Applicant notes that the embodiments and enabling technologies described previously herein in the context of overlay metrology system 100 should be interpreted to extend to method 200. It is further noted, however, that the method 200 is not limited to the architecture of overlay metrology system 100.

In one embodiment, the method 200 includes a step 202 of measuring an optical overlay of a hybrid overlay target on a sample based on optically-resolvable features of the hybrid overlay target. For example, step 202 may be performed using an optical overlay metrology tool such as, but not limited to, the optical metrology tool 102. In another embodiment, the method 200 includes a step 204 of measuring a device-scale overlay of the hybrid overlay target based on device-scale features of the hybrid overlay target. For example, step 204 may be performed using a high-resolution metrology tool such as, but not limited to, the particle-beam metrology tool 104. In another embodiment, the method 200 includes a step 206 of determining optical tool error adjustments for the hybrid overlay target based on a difference between the optical overlay and the device-scale overlay. For example, step 202 may be performed using an optical overlay metrology tool such as, but not limited to, the controller 108.

For the purposes of the present disclosure, the term "optically-resolvable" indicates that at least a portion of the features are resolvable with a selected optical metrology tool (e.g., the optical metrology tool 102) within selected tolerances. Further, "device-scale" features may include one or more characteristics (e.g., line-widths, separation distances between features, or the like) similar to device features to be incorporated into a fabricated device. It is recognized herein that certain device features may be at least partially resolvable in the selected optical metrology tool, but may further contain characteristics below the resolution of the selected optical metrology tool. It is to be understood that the terms "optically-resolvable" features and "device-scale" features are illustrative and are not intended to limit the size, orientation, or distribution of any patterned features on the sample.

It is further recognized herein that optical overlay measurements based on optically-resolvable features of an overlay target may exhibit optical tool errors associated with differences between the size, orientation, and/or density of the optically-resolvable features with respect to the device features of interest. Accordingly, an optical overlay measurement of an overlay target may exhibit a systematic error with respect to the actual overlay of device features of interest.

In steps 202-206 of the method 200, optical tool error may be characterized using a hybrid overlay target including both optically-resolvable features and device-scale features. The step 202 may thus include measuring the overlay of the hybrid overlay target using the optically-resolvable features and step 204 may include measuring the overlay of the same hybrid overlay target using the device-scale features. The magnitude and the direction of the difference between the optical overlay and the device-scale overlay may then be used to correct for the systematic optical tool error in any current or future measurements.

For example, once the optical tool error adjustments of step 206 are determined, device-relevant overlay may be efficiently generated by measuring optical overlay of the hybrid overlay target and adjusting the optical overlay with the known optical tool error adjustments. In this regard, an overlay metrology system (e.g., overlay metrology system 100, or the like) may generate device-relevant overlay measurements while taking advantage of the benefits of optical overlay metrology such as, but not limited to, high throughput capabilities and low-noise measurements derived from the use of repetitive features.

The optically-resolvable features and the device-scale features of the hybrid overlay target may have any orientation or distribution in the hybrid overlay target suitable for providing both optical and device-scale overlay in the same direction or directions. In one embodiment, the optically-resolvable features and the device-scale features are physically separated. For example, optical metrology targets with embedded device-scale features are generally described in U.S. Pat. No. 9,093,458 titled "DEVICE CORRELATED METROLOGY (DCM) FOR OVL WITH EMBEDDED SEM STRUCTURE OVERLAY TARGETS" issued on Jul. 28, 2015, which is incorporated herein by reference in its entirety. In another embodiment, at least some of the optically-resolved features of the hybrid overlay target are segmented with a device-scale pitch. In this regard, the optical overlay measurements and the device-scale overlay measurements may be performed in the same physical location, which may provide increased accuracy of the overlay tool error. For example, segmented targets having optically-resolvable features and device-scale features are generally described in U.S. Patent Publication No. US 2014/0307256 titled "Process Compatible Segmented Targets and Design Methods" and published on Oct. 16, 2014, which is incorporated herein by reference in its entirety.

Figure 3:
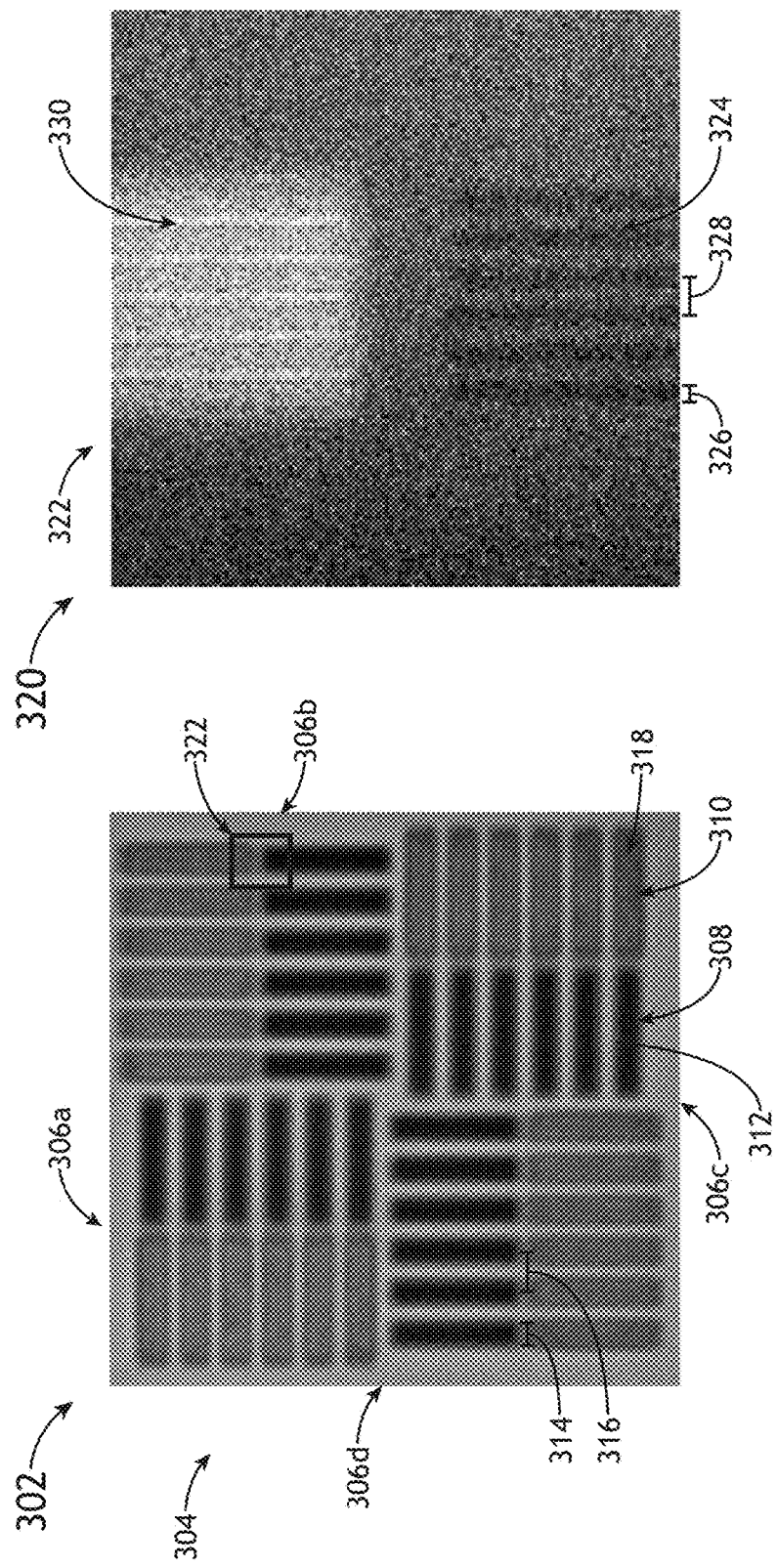
FIG. 3 is a series of images of a hybrid overlay target with optically-resolvable features segmented with device-scale features, in accordance with one or more embodiments of the present disclosure.

FIG. 3 is a series of images of a hybrid overlay target with optically-resolvable features segmented with device-scale features, in accordance with one or more embodiments of the present disclosure. The optical image 302 illustrates an advanced imaging metrology (AIM) overlay target 304 suitable for measuring overlay between two sample layers. For example, the target 304 includes four quadrants 306*a-d*, each having first-layer features 308 in a first layer of the sample and second-layer features 310 in a second layer of the sample such that relative positions between the first-layer features 308 and the second-layer features 310 is indicative of overlay between the first and second layers. Further, two of the quadrants (e.g., quadrants 306*a,c*) may provide overlay along a first direction and two of the quadrants (e.g., quadrants 306*b,d*) may provide overlay along a second direction.

In one embodiment, the features of optical image 302 (e.g., the first-layer features 308 and/or the second-layer features 310) are segmented to include both optically-resolvable and device-scale elements. For example, as illustrated in optical image 302, the first-layer features 308 may be segmented to include first-layer optically-resolvable segments 312 with an optically-resolvable width 314 distributed with an optically-resolvable pitch 316. Similarly, the second-layer features 310 may be segmented to include second-layer optically-resolvable segments 318 with the optically-resolvable width 314 and the optically-resolvable pitch 316.

Further, at least some of the features of optical image 302 (e.g., the first-layer optically-resolvable segments 312 and/or the second-layer optically-resolvable segments 318) may be further segmented to include device-scale features. The device-scale image 320 illustrates a portion 322 of the target 304 shown at a higher magnification. For example, the first-layer optically-resolvable segments 312 may be segmented with device-scale features 324 with a sub-resolution width 326 and/or a sub-resolution pitch 328 not resolvable with a selected optical metrology tool (e.g., the optical metrology tool 102) within selected tolerances. Similarly, the second-layer optically-resolvable segments 318 may be segmented with device-scale features 330 with the sub-resolution pitch 328 and sub-resolution width 326.

Accordingly, an optical overlay between the first and the second layers may be generated (e.g., with the optical metrology tool 102) based on the relative positions of the first-layer optically-resolvable segments 312 and the second-layer optically-resolvable segments 318, whereas a device-scale overlay may be generated (e.g., with the particle-beam metrology tool 104) based on the relative positions of the first-layer device-scale features 324 and the second-layer device-scale features 330. The optical tool error (e.g., (Optical Tool Error)$_{target}$ of equation 1) may then be determined based on the difference between the optical overlay and the device-scale overlay.

It is to be understood that the image-based target 304 illustrated in FIG. 3, along with the associated description above, is provided solely for illustrative purposes and should not be interpreted as limiting. For example, an overlay target suitable for optical overlay measurements may have any distribution of optically-resolvable features on any layer of the sample 118. By way of another example, an overlay target may be configured for overlay measurements using non-image-based overlay techniques such as, but not limited to, scatterometry-based techniques. In this regard, an optical metrology tool 102 may capture diffraction orders associated with the simultaneous interaction of the optical illumination beam 116 with overlay target features on multiple sample layers of interest and determine the overlay may be determined using a model-based analysis of the captured signal.

By way of another example, a target such as, but not limited to, the target 304 may include periodic structures (e.g., periodically-distributed features in one or more directions). It is recognized herein that targets having periodic features in one or more layers may provide multiple measurement locations. For example, overlay may be measured relative to any of the periodic elements. In this regard, targets having periodic elements in one or more layers may thus enhance the accuracy and/or throughput of an overlay measurement (e.g., either an optical overlay measurement or a particle-based overlay measurement of device-scale features). For instance, at a given dose of illumination associated with the overlay measurement (e.g., deposited energy per area on a sample), overlay measurements of periodic features based on the multiple measurement locations may have a higher accuracy than an overlay measurement based on a single measurement location (e.g., a single feature). In another instance, a given overlay measurement accuracy may be obtained using a lower dose of illumination when based on the multiple measurement locations compared to an overlay measurement based on a single measurement location. It is further recognized herein that reducing the dose of illumination required to perform an overlay measurement may mitigate damage of the sample 118 and/or increase measurement throughput.

In another embodiment, the method 200 includes a step 208 of measuring target-to-device placement errors for one or more features within the device area with respect to the hybrid overlay target. In another embodiment, the method 200 includes a step 210 of generating one or more target-to-device adjustments for the device area based on the target-to-device placement errors.

It is recognized herein that overlay errors may be introduced at nearly every stage of fabrication and may vary spatially across the sample or temporally from one sample to the next or from one lot of samples to the next in a production run. For example, a lithography tool (e.g., a stepper, a scanner, or the like) may typically have a field of view smaller than a full sample and may thus divide the sample into a series (e.g., a grid) of exposure fields that may be separately exposed. Grid errors associated with misalignments of a reticle to the sample during an exposure step of one or more exposure fields may contribute to overlay errors that vary spatially across the sample. Additionally, aberrations in the lithography tool during exposure (e.g., lens aberrations, turbulence associated with heat, or the like) may result in spatially-varying pattern placement errors within a single exposure field. By way of another example, overlay errors may include process errors associated with the fabrication of three-dimensional structures on the sample based on the exposed patterns. Process errors may include, but are not limited to, distortions of an exposed pattern during lithography, etch-induced errors, polishing errors, or errors associated with variations in the sample. As a result, overlay measured at an overlay target may be subject to spatially-varying target-to-device errors based on the displacement between the overlay target and the device features.

Overlay targets may generally be placed at any location on the sample. However, the size, orientation, and/or density of features in a target may influence target placement. For example, overlay targets having optically-resolvable features are typically placed in scribe lines between dies of a sample in order to reserve space within the dies for device features and/or because optically-resolvable features may not adhere to process design rules. By way of another example, overlay targets having features that adhere to process design rules may typically be placed within sample dies near device features of interest or within the scribe lines.

Figure 4:
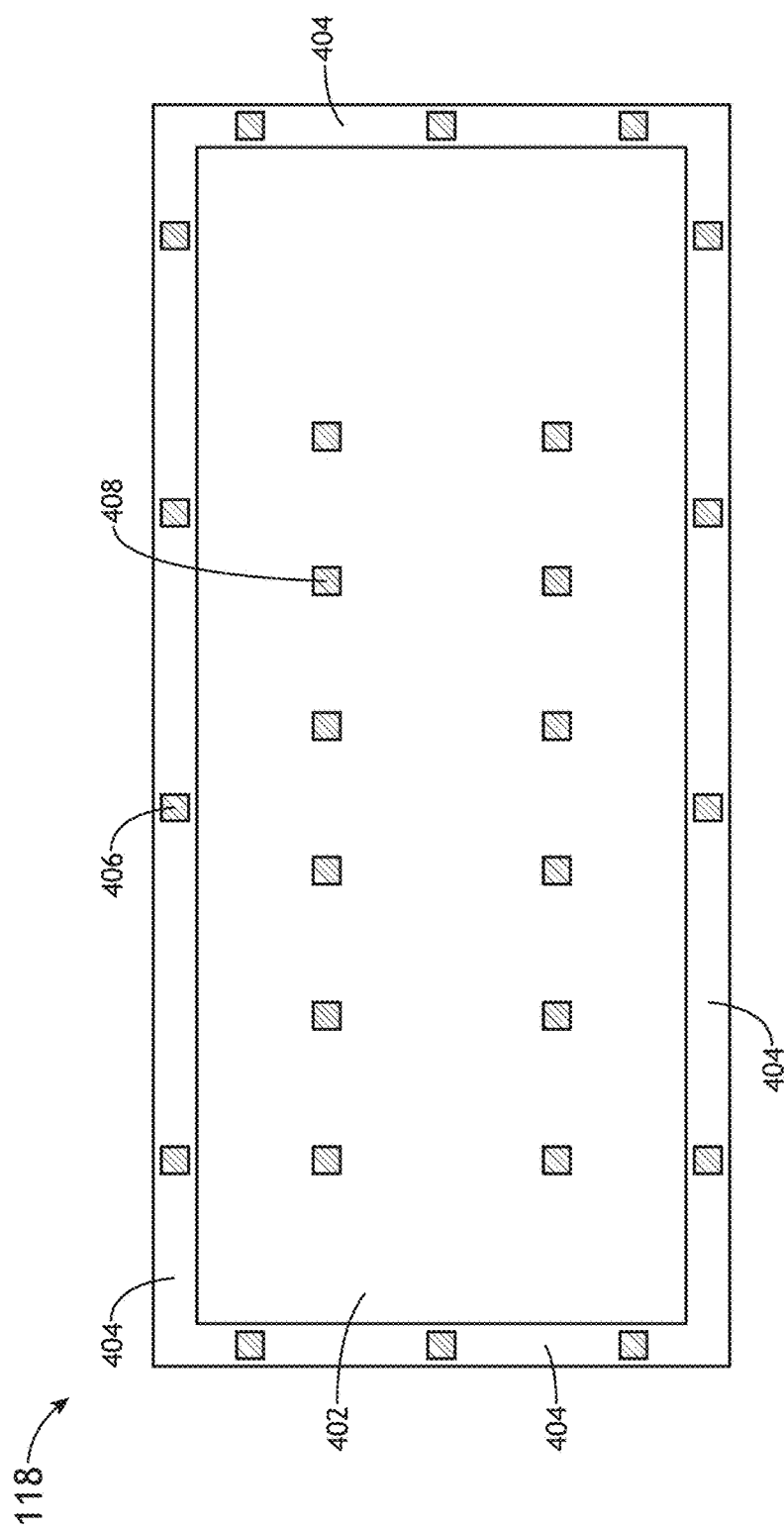
FIG. 4 is a conceptual top view of a wafer die illustrating the placement of overlay targets, in accordance with one or more embodiments of the present disclosure.

FIG. 4 is a conceptual top view of a wafer die illustrating the placement of overlay targets, in accordance with one or more embodiments of the present disclosure. A sample 118 may include at least one device areas (e.g., a die 402) surrounded by scribe lines 404. Further, the dies 402 may include device features associated with a device to be fabricated and the scribe lines 404 may provide buffer regions between the dies 402. In one embodiment, at least one hybrid overlay target 406 including both optically-resolvable features and device-scale features is located within the scribe lines 404. The hybrid overlay target 406 may thus be designed to provide sensitive overlay measurements and the size of the target may not reduce the available space on the sample 118 for device features. For example, the hybrid overlay target 406 may include, but is not required to include, optically-resolvable features segmented to include device-scale features such as the hybrid overlay target 304 illustrated in FIG. 3A. In another embodiment, one or more device-scale overlay targets 408 including device-scale features may be located at selected locations with the die 402 (e.g., as drop-in targets). For example, the hybrid overlay target 406 may be designed to adhere to device design rules, be relatively small and may include, but are not required to include, features having device-scale characteristics such as those illustrated in FIG. 3B.

Figure 5:
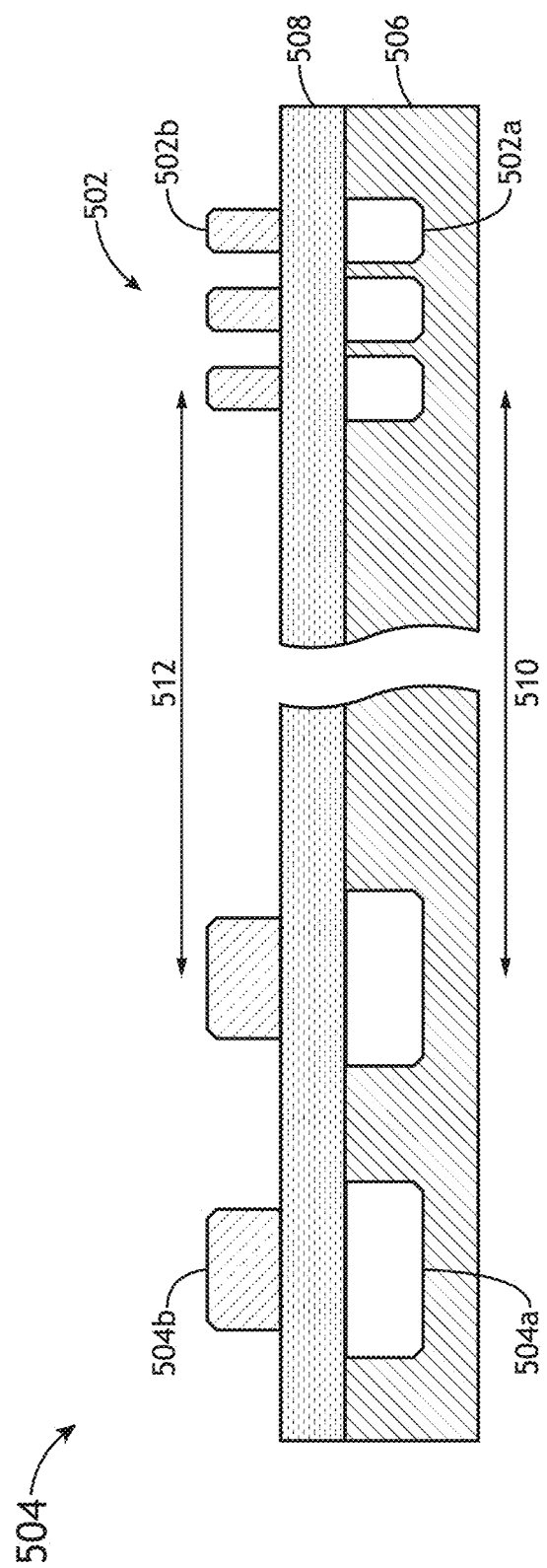
FIG. 5 is a conceptual profile view of overlay errors on device features and a spatially-separated overlay target, in accordance with one or more embodiments of the present disclosure.

FIG. 5 is a conceptual profile view of overlay errors on device features 502 and a spatially-separated overlay target 504, in accordance with one or more embodiments of the present disclosure.

In one embodiment, target-to-device overlay errors between a first layer 506 and a second layer 508 of the overlay target 504 are based at least in part on a difference between a pattern placement distance between the overlay target and device features for each layer (e.g., $\Delta PPE_{target\_to\_device}$ of equation 1). For example, a first-layer pattern placement distance 510 between first-layer target features 504a and device features 502a may vary as a function of position of the device features 502a across an exposure field. Similarly, a second-layer pattern placement distance 512 between second-layer target features 504b and device features 502b may vary as a function of position of the device features 502b across the exposure field. Further, the first-layer pattern placement distance 510 and the second-layer pattern placement distance 512 may differ from each other at any given position, giving rise to location-dependent target-to-device overlay errors. Accordingly, step 210 may include generating target-to-device adjustments based on differences between the first-layer pattern placement distance 510 and the second-layer pattern placement distance 512 (e.g., $\Delta PPE_{target\_to\_device}$ of equation 1) measured at various locations within the die 402. It is to be understood that although FIG. 5 illustrates overlay measurements along a single direction, displacement may be measured along multiple directions.

Figure 6:
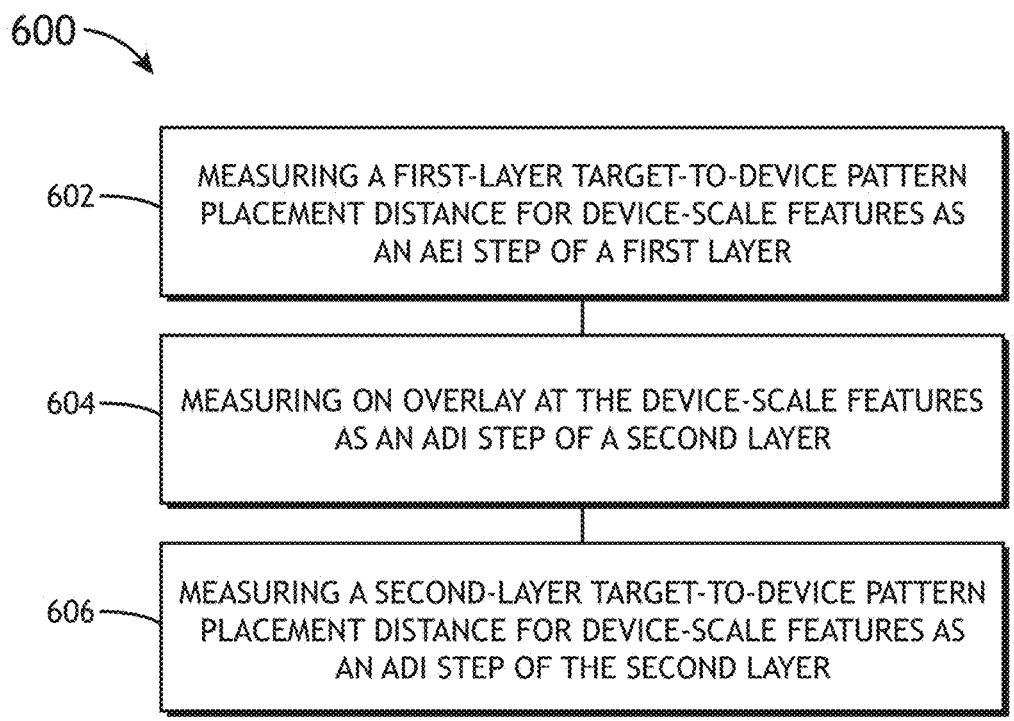
FIG. 6 is a flow diagram illustrating sub-steps for generating target-to-device adjustments, in accordance with one or more embodiments of the present disclosure.

In one embodiment, the pattern placement distances are measured directly for each layer using an EPM tool such as, but not limited to, the EPM tool 106 of the overlay metrology system 100. FIG. 6 is a flow diagram illustrating sub-steps for generating target-to-device adjustments, in accordance with one or more embodiments of the present disclosure. In one embodiment, step 210 includes a sub-step 602 of measuring a first-layer pattern placement distance 510 for one or more device-scale features (e.g., a device-scale overlay target, device features of interest, or the like) within the die 402 as an AEI step after the exposure and etching of the first layer 506. In another embodiment, step 210 includes a sub-step 604 of measuring an overlay at the device-scale features as an ADI step after the exposure of the second layer 508. For example, the sub-step 604 may provide a calibration between the pattern placement distance measurements for the measured layers. In another embodiment, step 210 includes a sub-step 606 of measuring a second-layer pattern placement distance 512 for the one or more device-scale features as an ADI step after the exposure of the second layer 508. Accordingly, the target-to-device adjustments may be determined based on a difference between the first-layer pattern placement distance 510 and the second-layer pattern placement distance 512.

As described previously herein, the EPM may operate based on optical imaging or particle-beam imaging. For example, in the case of EPM tool based on particle-beam imaging, the first-layer pattern placement distance 510 of sub-step 602 may be measured using a low energy particle beam, the overlay of the device-scale features may be measured using a low energy particle beam for features in the second layer 508 and a high-energy particle beam for features in the first layer 506, and the second-layer pattern placement distance 512 may be measured using a low energy particle beam.

In another embodiment, target-to-device adjustments are based at least in part on differences between device-scale overlay measured on the hybrid overlay target and device-scale overlay targets in the in the die 402. For example, referring again to FIG. 4, target-to-device adjustments may be generated based on differences between overlay measured at a hybrid overlay target 406 located in the scribe lines 404 and overlay measured at one or more device-scale overlay targets 408 in the die 402. In this regard, the variations between the device-scale overlay measured at the multiple locations across the sample 118 may provide a mapping of intra-field variations that may be corrected by corresponding target-to-device adjustments. Further, such target-to-device adjustments based on overlay variations across the sample may be generated using an overlay metrology tool (e.g., the particle-beam metrology tool 104) without the need for an EPM with a high-accuracy stage (e.g., sample stage 152).

Referring again to FIG. 2, in another embodiment, the method 200 includes a step 212 of determining device-relevant overlay measurements for one or more positions within the device area. In one embodiment, the device-relevant overlay measurements are generated based on the optical overlay of step 202, the optical tool error adjustments of step 206, and the target-to-device adjustments of step 210.

For example, referring again to FIGS. 4 and 5, a device-relevant overlay at a particular location within the die 402 (e.g., $OVL_{device}$ of equation 1) may be characterized as a relative displacement between first-layer device features 502a and second-layer device features 502b from nominal positions. This device-relevant overlay measurement may be determined indirectly based on adjusted measurements of a hybrid overlay target 406 (e.g., see equation 1). For instance, an on-target optical overlay measurement ($OVL_{target}$) may be determined based on optically-resolvable features of the overlay target 504 (not shown in FIG. 5). An optical tool error ((Optical Tool Error)$_{target}$) may be determined based on a difference between the optical overlay and an on-target overlay of device-scale target features (e.g., target features 504). Further, target-to-device errors ($\Delta PPE_{target\_to\_device}$) may be determined through direct measurements of the first-layer pattern placement distance 510 and the second-layer pattern placement distance 512 at multiple locations and/or by measuring overlay variations at device-scale overlay targets 408.

In another embodiment, device-relevant overlay measurements are expressed as a transformation between optical overlay measurements of the hybrid overlay target and device-relevant overlay measurements. For example, referring again to FIG. 3 illustrating a hybrid overlay target having elements segmented into include both optically-resolvable features and device-scale features, the periodic nature of the overlay target may be harnessed to provide a highly-sensitive transformation between the optical overlay measurements of the hybrid AIM overlay target and device-relevant overlay measurements. For instance, measuring overlay of a common region of interest with both an optical metrology tool (e.g., optical metrology tool 102) and a device-resolvable metrology tool (e.g., particle-beam metrology tool 104) may provide images having periodic signals including spatial-frequency harmonics based on both the optically-resolvable pitch 316 and the sub-resolution pitch 328:

$$Ker_{device} = \sum_i A^i_{device} \cos\left(i\frac{2\pi}{P_{device}}x + \phi^i_{device}\right); \quad (2)$$

$$Ker_{optical} = \sum_i A^i_{optical} \cos\left(i\frac{2\pi}{P_{optical}}(x + \Delta PPE_{target\_to\_device}) + \phi^i_{device}\right); \quad (3)$$

where $Ker_{device}$ represents device-scale features with the $i^{th}$-order harmonics having amplitudes $A_{device}^i$ and phases $\phi_{device}^i$ represents the $i^{th}$-order harmonics of the optically-resolvable features having amplitudes $A_{optical}^i$ and phases $\phi_{optical}^i$, $P_{device}$ is the sub-resolution pitch 328, $P_{optical}$ is the optically-resolvable pitch 316, $\Delta PPE_{target\_to\_device}$ is the target-to-device error of equation 1, and x is the measurement direction. It is noted herein that $\Delta PPE_{target\_to\_device}$ at each location in the field is represented as a shift in the x-direction.

The components spatial-frequency harmonics $Ker_{device}$ and $Ker_{optical}$ (excluding the $\Delta PPE_{target\_to\_device}$) may be determined using any method known in the art such as, but not limited to, a spatial frequency analysis of images of the region of interest generated with both the optical metrology tool and the device-resolvable metrology tool. For example, the spatial frequency analysis may include a Fourier analysis technique such as, but not limited to, a Fourier Transform (FT) analysis, a Fast Fourier Transform (FFT) analysis, or the like.

The signal associated with the optically-resolvable features of a hybrid overlay target 406 may then be related to the device-relevant signals at each of the device-scale overlay targets 408 with the measured $\Delta PPE_{target\_to\_device}$ and the transformation (T):

$$T(A_{optical}^i, \phi_{optical}^i) \rightarrow (A_{device}^i, \phi_{device}^i) \quad (5).$$

Further, the transformation (T) may monitor and/or compensate for additional inaccuracies of the hybrid overlay target 406 and/or the optical measurement of overlay using the hybrid overlay target 406. It is recognized herein that measurements of overlay targets may be may include a variety of errors associated with target and/or system imperfections that may or may not be known prior to a measurement. For example, metrics for assessing the quality and/or accuracy of overlay targets are described generally in U.S. Pat. No. 9,329,033 titled "METHOD FOR ESTIMATING AND CORRECTING MISREGISTRATION TARGET INACCURACY" issued on May 3, 2016 and U.S. Patent Publication No. 2013/0035888 titled "METHOD AND SYSTEM FOR PROVIDING A QUALITY METRIC FOR IMPROVED PROCESS CONTROL" published on Feb. 7, 2013, both of which are incorporated herein by reference in their entirety.

Referring again to FIG. 2, in another embodiment, the method 200 includes a step 214 of providing overlay correctables for the device area to a lithography tool to modify exposure conditions for at least one subsequent exposure based on the device-relevant overlay measurements.

For example, step 214 may include generating control parameters (or corrections to the control parameters) for fabrication tools such as, but not limited to, lithography tools based on the device-relevant overlay. The control parameters may be generated by a control system such as, but not limited to, the controller 108 of the overlay metrology system 100. The overlay correctables may be provided as part of a feedback and/or a feedforward control loop. In one embodiment, the device-relevant overlay measurements associated with a current process step measured on a sample are used to compensate for drifts of one or more fabrication processes and may thus maintain overlay within selected tolerances across multiple exposures on subsequent samples in the same or different lots. In another embodiment, the device-relevant overlay measurements associated with a current process step may be fed-forward to adjust subsequent process steps to compensate for any measured overlay errors. For example, the exposure of patterns on subsequent layers may be adjusted to match the measured overlay of the subsequent layers.

Overlay correctables may be generated and/or sent at any selected frequency. For example, the frequency at which overlay correctables may be generated (on a given sample and/or in a given lot) may depend on the throughput of the overlay measurement. Further, adjustments to optical overlay measurements may be generated at any selected frequency.

In one embodiment, device-relevant overlay adjustments such as, but not limited to, the optical tool error adjustments generated in step 206 and/or the target-to-device adjustments of step 210 may be generated less frequently than the optical overlay measurements of step 202. For example, the device-relevant overlay adjustments may be generated at a selected interval such as, but not limited to, once per lot, once per a selected number of lots, or the like, whereas the optical overlay measurements of hybrid overlay targets may be performed on multiple locations across a sample. In this regard, the optical overlay measurements of each sample may be adjusted using previously generated device-relevant adjustments to provide accurate device-relevant overlay with the throughput of the optical metrology tool suitable for in-line control during a production run.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
a controller, the controller including one or more processors configured to execute program instructions configured to cause the one or more processors to:
generate optical tool error adjustments for a hybrid overlay target including optically-resolvable features and device-scale features, by measuring a difference between an optical overlay measurement based on the optically-resolvable features and a device-scale overlay measurement based on the device-scale features;
generate target-to-device adjustments for the hybrid overlay target based on positions of features within a device area;
determine device-relevant overlay measurements for one or more locations in the device area based on at least one of the optical overlay measurement, the optical tool error adjustments, or the target-to-device adjustments; and
provide overlay correctables for the device area to a lithography tool to modify exposure conditions for at least one subsequent exposure based on the device-relevant overlay measurements.

2. The metrology system of claim 1, wherein the positions of the features within the device area for determining the target-to-device adjustments comprise:
pattern placement distances between the hybrid overlay target and the features within the device area for two or more layers of the sample.

3. The metrology system of claim 2, wherein the pattern placement distances between the hybrid overlay target and the features within the device area are received from an edge-placement metrology tool comprising:
a translation stage for securing the sample, wherein the translation stage has a range of motion at least equal to a separation between the hybrid overlay target and the device-scale features within the device area; and
an imaging system, wherein the pattern placement distances include distances measured by the translation stage between the hybrid overlay target and the device-scale features.

4. The metrology system of claim 3, wherein the edge-placement metrology tool is integrated within at least one of an optical metrology tool or a particle-beam metrology tool.

5. The metrology system of claim 1, wherein the positions of the features within the device area for determining the target-to-device adjustments comprise:
overlay measurements within the device area.

6. The metrology system of claim 5, wherein the overlay measurements within the device area comprise:
overlay measurements of device features within the device area.

7. The metrology system of claim 5, wherein the overlay measurements within the device area comprise:
overlay measurements of device-scale overlay targets within the device area.

8. The metrology system of claim 1, wherein the optically-resolvable features are segmented to include periodically-distributed features providing multiple measurement locations, wherein the optical overlay measurement includes overlay determined based on the multiple measurement locations.

9. The metrology system of claim 1, wherein the device-scale features are segmented to include periodically-distributed features providing multiple measurement locations, wherein the device-scale overlay measurement includes overlay determined based on the multiple measurement locations.

10. The metrology system of claim 1, wherein the controller receives the optical overlay measurement from an optical metrology tool.

11. The metrology system of claim 10, wherein the optical metrology tool is an image-based overlay tool, wherein the optical overlay measurement is an image-based overlay measurement.

12. The metrology system of claim 10, wherein the optical metrology tool is a scatterometry-based overlay tool, wherein the optical overlay measurement is a scatterometry-based overlay measurement.

13. The metrology system of claim 1, wherein the controller receives the device-scale overlay measurement from a particle-beam metrology tool.

14. The metrology system of claim 13, wherein the particle-beam metrology tool comprises:
a scanning electron microscope metrology tool.

15. The metrology system of claim 14, wherein the scanning electron microscope metrology tool comprises:
a critical-dimension scanning electron microscope.

16. The metrology system of claim 13, wherein the particle-beam metrology tool comprises:
a focused ion beam metrology tool.

17. The metrology system of claim 1, wherein the device area is a die of the sample.

18. The metrology system of claim 1, wherein the hybrid overlay target is located in a scribe line of the sample.

19. The metrology system of claim 1, wherein at least one of the optical overlay measurement of the hybrid overlay target, the device-scale overlay measurement of the hybrid overlay target, or measurements of the positions of the features within the device area for determining the target-to-device adjustments comprise:
after development inspection data.

20. The metrology system of claim 1, wherein at least one of the optical overlay measurement of the hybrid overlay target, the device-scale overlay measurement of the hybrid overlay target, or measurements of the positions of the features within the device area for determining the target-to-device adjustments comprise:
after etch inspection data.

21. The metrology system of claim 1, wherein the optically-resolvable features and the device-scale features of the hybrid overlay target are physically separated.

22. The metrology system of claim 1, wherein at least some of the optically-resolvable features are segmented, wherein the device-scale features form segments of the optically-resolvable features.

23. The metrology system of claim 1, wherein the device-scale features of the hybrid overlay target are compatible with design rules of device features within the device area.

24. The metrology system of claim 1, wherein the metrology system is configured as an overlay metrology system.

25. The metrology system of claim 1, wherein the metrology system is configured as an edge placement metrology system.

26. A metrology system comprising:
an optical metrology tool configured to generate an optical overlay measurement based on optically-resolvable features of a hybrid overlay target on a sample;
a particle-beam metrology tool configured to generate a device-scale overlay measurement based on device-scale features of the hybrid overlay target;

an edge-placement metrology tool configured to measure positions of features within a device area of the sample with respect to the hybrid overlay target; and a controller communicatively coupled to the optical metrology tool and the particle-beam metrology tool, the controller including one or more processors configured to execute program instructions configured to cause the one or more processors to:

generate optical tool error adjustments for the hybrid overlay target based on a difference between the optical overlay measurement received by the optical metrology tool and the device-scale overlay measurement received by the particle-beam metrology tool;

generate target-to-device adjustments for the hybrid overlay target based on positions of features within the device area received by the edge-placement metrology tool;

determine device-relevant overlay measurements for one or more locations in the device area based on at least one of the optical overlay measurement, the optical tool error adjustments, or the target-to-device adjustments; and provide overlay correctables for the device area to a lithography tool to modify exposure conditions for at least one subsequent exposure based on the device-relevant overlay measurements.

27. The metrology system of claim 26, wherein the positions of the features within the device area for determining the target-to-device adjustments comprise:

pattern placement distances between the hybrid overlay target and the features within the device area for two or more layers of the sample.

28. The metrology system of claim 27, wherein the edge-placement metrology tool comprises:

a translation stage for securing the sample, wherein the translation stage has a range of motion at least equal to a separation between the hybrid overlay target and the device-scale features within the device area; and an imaging system, wherein the pattern placement distances include distances measured by the translation stage between the hybrid overlay target and the device-scale features.

29. The metrology system of claim 26, wherein the edge-placement metrology tool is integrated within at least one of the optical metrology tool or the particle-beam metrology tool.

30. The metrology system of claim 26, wherein the positions of the features within the device area for determining the target-to-device adjustments further comprise:

overlay measurements within the device area measured using at least one of the optical metrology tool or the particle-beam metrology tool.

31. The metrology system of claim 30, wherein the overlay measurements within the device area comprise:

overlay measurements of device features within the device area.

32. The metrology system of claim 30, wherein the overlay measurements within the device area comprise:

overlay measurements of device-scale overlay targets within the device area.

33. The metrology system of claim 26, wherein the optically-resolvable features are segmented to include periodically-distributed features providing multiple measurement locations, wherein the optical overlay measurement includes overlay determined based on the multiple measurement locations.

34. The metrology system of claim 26, wherein the device-scale features are segmented to include periodically-distributed features providing multiple measurement locations, wherein the device-scale overlay measurement includes overlay determined based on the multiple measurement locations.

35. The metrology system of claim 26, wherein the optical metrology tool is an image-based overlay tool, wherein the optical overlay measurement is an image-based overlay measurement.

36. The metrology system of claim 26, wherein the optical metrology tool is a scatterometry-based overlay tool, wherein the optical overlay measurement is a scatterometry-based overlay measurement.

37. The metrology system of claim 26, wherein the particle-beam metrology tool comprises:

a scanning electron microscope metrology tool.

38. The metrology system of claim 37, wherein the scanning electron microscope metrology tool comprises:

a critical-dimension scanning electron microscope.

39. The metrology system of claim 26, wherein the particle-beam metrology tool comprises:

a focused ion beam metrology tool.

40. The metrology system of claim 26, wherein the metrology system is configured as an overlay metrology system.

41. The metrology system of claim 26, wherein the metrology system is configured as an edge placement metrology system.

42. A metrology method comprising:

measuring an optical overlay of a hybrid overlay target on a sample based on optically-resolvable elements of the hybrid overlay target;

measuring a device-scale overlay of the hybrid overlay target based on device-scale elements of the hybrid overlay target;

determining optical tool error adjustments for the hybrid overlay target based on a difference between the optical overlay and the device-scale overlay;

measuring target-to-device placement errors for one or more features within a device area with respect to the hybrid overlay target;

generating one or more target-to-device adjustments for the device area based on the target-to-device placement errors;

determining device-relevant overlay measurements for one or more positions within the device area based on the optical overlay, the optical tool error adjustments, and the target-to-device adjustments; and providing overlay correctables for the device area to a lithography tool to modify exposure conditions for at least one subsequent sample based on the device-relevant overlay measurements.

* * * * *